United States Patent
Yamawaki et al.

(10) Patent No.: US 6,608,510 B2
(45) Date of Patent: Aug. 19, 2003

(54) PLL CIRCUIT AND WIRELESS MOBILE STATION WITH THAT PLL CIRCUIT

(75) Inventors: Taizo Yamawaki, Tokyo (JP); Satoshi Tanaka, Kokubunji (JP); Norio Hayashi, Tamamuramachi (JP); Kazuo Watanabe, Takasaki (JP); Bob Henshaw, Cambridge (GB)

(73) Assignees: Hitachi, Ltd., Tokyo (JP); TTP Com Limited, Hertfordshire (GB)

( * ) Notice: Subject to any disclaimer, the term of this patent is extended or adjusted under 35 U.S.C. 154(b) by 0 days.

(21) Appl. No.: 09/820,881

(22) Filed: Mar. 30, 2001

(65) Prior Publication Data

US 2002/0084814 A1 Jul. 4, 2002

(51) Int. Cl.[7] ................................................. H03L 7/06
(52) U.S. Cl. ......................... 327/156; 327/147; 331/34; 375/376
(58) Field of Search .............................. 327/156, 157, 327/158, 159, 147, 148; 375/327, 376; 331/17, 18, 25, 34

(56) References Cited

U.S. PATENT DOCUMENTS

| | | | |
|---|---|---|---|
| 4,115,745 A | | 9/1978 | Egan ............................. 331/17 |
| 4,459,561 A | | 7/1984 | Clark et al. ..................... 331/65 |
| 4,862,106 A | * | 8/1989 | Toda et al. ...................... 331/2 |
| 4,890,072 A | * | 12/1989 | Espe et al. ..................... 331/11 |
| 5,208,546 A | * | 5/1993 | Nagaraj et al. .............. 327/157 |
| 5,220,294 A | * | 6/1993 | Ichikawa ...................... 331/17 |
| 5,686,866 A | * | 11/1997 | Badger ......................... 331/17 |
| 5,748,046 A | * | 5/1998 | Badger ......................... 331/17 |
| 5,758,274 A | * | 5/1998 | Vu et al. .................... 455/246.1 |
| 5,937,335 A | * | 8/1999 | Park et al. ..................... 455/86 |
| 6,150,890 A | * | 11/2000 | Damgaard et al. ............. 331/14 |
| 6,163,585 A | * | 12/2000 | Yamawaki et al. .......... 375/373 |
| 6,215,362 B1 | * | 4/2001 | Feng et al. .................... 331/17 |
| 6,466,067 B2 | * | 10/2002 | Matsui ......................... 327/156 |

FOREIGN PATENT DOCUMENTS

| | | |
|---|---|---|
| DE | 4342344 | 6/1995 |
| EP | 0326940 | 8/1989 |
| EP | 0856946 | 8/1998 |
| GB | 2338127 | 12/1999 |

OTHER PUBLICATIONS

Yamawaki et al, "A 2.7–V GSM RF Transceiver IC", IEEE Journal of Solid–State Circuits, vol. 32, No. 12, Dec. 1, 1997, pp. 2089–2096.

IEEE Journal of Solid–State Circuits, vol. 32, No. 12, "A 2.7–V GSM RF Transceiver IC", pp. 2089–2096.

* cited by examiner

Primary Examiner—Timothy P. Callaghan
Assistant Examiner—Hai L. Nguyen
(74) Attorney, Agent, or Firm—Mattingly, Stanger & Malur, P.C.

(57) ABSTRACT

The present invention provides a PLL circuit, which can make convergence at a high speed and convert an IF signal into an RF signal, and a wireless mobile station with that PLL circuit. An LPF charging constant current source, a discharging constant current source and a high-speed charging constant current source are connected to an output terminal of a phase comparator with current mode output of the PLL circuit. By doing so, in the case where a convergence frequency of the PLL circuit is low, an input voltage of a VCO is increased from 0V so as to be converged by using the constant current source. Meanwhile, in the case where the convergence frequency of the PLL circuit is high, the input voltage of the PLL circuit is temporarily increased to the maximum voltage by using the constant current source. Thereafter, the input voltage is gradually dropped from the maximum voltage so as to be converged by using the constant current source. Thus, the above operation is selected by the convergence frequency, and thereby, it is possible to shorten the maximum convergence time of the PLL circuit.

18 Claims, 15 Drawing Sheets

PLL CIRCUIT AND WIRELESS MOBILE STATION WITH THAT PLL CIRCUIT

This is a divisional application of U.S. application No. 09/819,810, filed Mar. 29, 2001.

TECHNICAL FIELD OF THE INVENTION

The present invention relates to a technology effectively applicable to a high-speed convergence of a PLL circuit, which converts an IF (Intermediate Frequency) signal into a RF (Radio Frequency) signal.

BACKGROUND OF THE INVENTION

There exist some systems in a transmitter used for mobile station. The most popular system is a mixer system which is constructed in a manner of converting a base band signal into an IF (Intermediate Frequency) signal by a modulator, and converting the IF signal into a frequency to be transmitted from an antenna by a mixer. Besides, there is a PLL system, which makes a frequency conversion by using a PLL circuit in place of the above mixer used in the system. The PLL system has a demerit of treating only modulation with constant envelop; however, the PLL system has a merit of greatly reducing a transmission noise as compared with the mixer system. Thus, the PLL system is used for a wireless mobile station of a GSM (Global System for Mobile communications) system. The operating principle has been described in detail in IEEE journal of solid-state circuits Vol. 32, No. 12, pp. 2089–2096, "A 2.7-V GSM RF Transceiver IC", for example.

FIG. 12 is a view showing a construction of the PLL circuit used in the PLL system. The PLL circuit is composed of a phase comparator 100 with current mode output, a constant current source 101, a mixer 105, a low-pass filter (LPF) 103, a voltage-controlled oscillator (VCO) 104, and a switch (SW) 102. In the following description, it is assumed that the VCO 104 has a positive sensitivity. In general, as the LPF 103, a secondary LPF comprising a passive element as shown in FIG. 12 is used. Moreover, a control signal LOGIC1 is given to the switch SW 102. In the case where the LOGIC1 is zero "0", the switch SW 102 becomes an open state; on the other hand, in the case where the LOGIC1 is "1", the switch SW 102 is short-circuited to ground.

As the phase comparator 100 with current mode output, a high-speed operable phase comparator with mixer is used, and not a phase frequency comparator, and thereby, it is possible to improve a degree of freedom in frequency construction of a transmitter. The phase comparator has a problem such that in the case where a difference between two input frequencies is great, an output voltage is suppressed by the LPF 103; as a result, no output voltage is transmitted to the VCO 104. In other words, the PLL circuit is not converged depending upon an output frequency from the VCO 104 in the initial convergence state. In order to solve the above problem, the constant current source 101 and the switch SW 102 are connected. Before the PLL circuit is converged, the SW 102 is necessarily connected to ground so as to set an input voltage of the VCO 104 to a ground voltage. Thereafter, the switch SW 102 is opened so as to start convergence. Even in the case where no output of the phase comparator 100 with current mode output is transmitted to the VCO 104, the constant current source 101 charges the capacity of the LPF 103, and thereby, an input voltage of the VCO 104 increases. By doing so, two input frequencies of the phase comparator 100 with current mode output can approach each other. When these two input frequencies sufficiently approach each other, the output of the phase comparator 100 with current mode output is transmitted to an input of the VCO 104; therefore, convergence is possible.

In the GSM system, a TDMA (Time Division Multiple Access) system is used. One frame is 120/26 ms, and is composed of eight time slots of 15/26 ms. One slot is used for reception, and another slot is used for transmission. FIG. 13 is a view showing one example of reception and transmission timing of a mobile station. In this example, a time slot 1 is allocated to reception, and a time slot 4 is allocated to transmission. A reception-transmission interval is equivalent to a period of two time slots. However, in this case, considering a delay from the mobile station to a base station, the transmission is early made by a timing advance of 3024/13 μs to the maximum.

The following is a description on an operation of the above PLL system according to the TDMA system of the GSM. The operation of the PLL system will be described below with reference to the conventional PLL circuit and a timing chart shown in FIG. 14. For convenience of explanation, an input center frequency of the phase comparator 100 with current mode output is set as 270 MHz, and a frequency of local oscillator signal LO inputted to the mixer 105 is set as 1180 MHz. Moreover, an input sensitivity of the VCO 104 is positive, and an output frequency thereof is set as 850 MHz when an input voltage is 0V. In the case where the mobile station is not in a transmission timing state, "1", is inputted to the LOGIC1, and therefore, the output of the phase comparator 100 with current mode output becomes 0V. Whereby an electric charge stored in the capacity of LPF 103 is discharged, and therefore, the input voltage of the VCO 104 becomes 0V, too. Thus, an output frequency of the VCO 104 becomes 850 MHz. When a time t1 comes, "0" is inputted to the LOGIC1, and the SW 102 becomes an open state. At that time, an output frequency of the mixer 105 is the sum and the difference between 850 MHz and 1180 MHz, that is, 2030 MHz and 330 MHz. The sum component is suppressed by the LPF 103, and does not contribute to convergence; for this reason, only difference component is considered in this case. Therefore, the output frequency of the phase comparator 100 with current mode output becomes 60 MHz (=330−270). In the case of applying the PLL circuit to the GSM system, in general, the loop bandwidth of the PLL circuit is designed to be around 1 MHz; for this reason, an output signal of the mixer 105 is sufficiently suppressed by the LPF 103. Thus, the output signal does not contribute for storing an electric charge to the capacity of the LPF 103. Namely, feedback becomes an off state. However, an electric charge is stored in the capacity of the LPF 103 by a constant current from the constant current source 101, so that an input voltage of the VCO 104 can be increased. As a result, the output frequency of the VCO 104 gradually increases from 850 MHz. For example, in the case where the input voltage of the VCO 104 increases to 908 MHz, at that time, an output frequency of the phase comparator 100 with current mode output becomes 2 MHz. Therefore, the suppression by the LPF 103 is decreased, and this can contribute for storing an electric charge to the capacity of the LPF 103. Namely, a recovery of feedback is made. The recovery of feedback is made, and thereby, the PLL circuit is finally converged, and then, the output frequency of the VCO 104 becomes 910 MHz (=1180−270). The convergence must be completed earlier than a time t2 when a transmitting period starts. At a time t3 when the transmitting period ends, "1" is inputted to the LOGIC1, and then, the input voltage of the VCO 104 again becomes 0V in preparation for the next transmitting period.

FIG. 15 is a view showing a change of input voltage of the VCO 104 in the above convergence process. The input voltage of the VCO 104 is 0V by the time t1. The switch SW 102 becomes an open state at the time t1, and then, the input voltage starts to increase linearly. An inclination of the increase is determined mainly by an output current I1 of the constant current source 101 and the total capacity C of the LPF 103, and therefore, is obtained from a relation of I1/C. Thereafter, the recovery of feedback is made, and the convergence is completed. Assuming that a sensitivity of the VCO 104 is set as Kv, the output frequency of the VCO 104 is set as f0 when its input voltage is 0V, the output frequency of the VCO 104 in convergence is set as f1, the input voltage V1 in convergence is obtained from the following equation (1).

$$V1=(f1-f0)/Kv \qquad (1)$$

A convergence time ts of the PLL circuit approximates to a time until the total capacity C is charged to V1 by the output current I1; therefore, the convergence time ts is obtained from the following equation (2).

$$ts=(f1-f0)/Kv \cdot C/I1 \qquad (2)$$

Therefore, the higher f1 is, the longer the convergence time becomes. For example, in the GSM system, the convergence time becomes the longest when a transmitting frequency is converged to the maximum usable frequency 915 MHz.

In recent years, a demand for high-speed data communication services has rapidly risen. With the demand, in the GSM system, some systems for improving a conventional data rate have been proposed, and research and development have been made for practical use. One of the high-speed data communication services is a GPRS (General Packet Radio Service). The GPRS is a system of allocating a plurality of time slots to transmission or reception so as to improve a data rate, as shown in FIG. 16. As is evident from a comparison between FIG. 13 and FIG. 16, in the GPRS, a time usable to the convergence of PLL circuit is about half of the conventional GSM system. For this reason, there is a need of shortening the convergence time of the PLL circuit.

SUMMARY OF THE INVENTION

As described before, the convergence time ts of the conventional PLL circuit is obtained from the above equation (2). In order to shorten the convergence time ts, there is a need of changing a parameter included in the above equation (2). In general, the VCO 104 is provided as a module component; therefore, its characteristic values, that is, f0 and Kv are a fixed value. Moreover, it is difficult to freely change I1/C due to the following limiting conditions 1) and 2).

1) A ratio of output current of the phase comparator 100 with current mode output to C is determined by a modulation bandwidth and an allowed noise level used as a system parameter.
2) A convergence stability of the PLL circuit is determined by a ratio of the output current to I1.

Namely, in the case of the conventional PLL circuit, it is difficult to shorten the convergence time while satisfying the above limiting conditions.

It is, therefore, an object of the present invention to shorten the maximum convergence time of a conventional PLL circuit while satisfying the above limiting conditions.

The above, other objects and novel constituent features of the present invention will be more apparent from the description of the present specification and the accompanying drawings.

The following is a brief description on an outline of disclosures of the present invention.

In order to achieve the above object, a PLL circuit of the present invention comprises at least: a phase comparator with current mode output; a low-pass filter; and a VCO. The PLL circuit sets an input voltage of the VCO as 0V before convergence start, and in the case where a convergence frequency of the PLL circuit is lower than a setting frequency, converges the input voltage by a PLL feedback loop within a range from 0V to a convergence voltage. Moreover, in the case where the convergence frequency of the PLL circuit is higher than the setting frequency, the PLL circuit increases the input voltage from 0V to a power-supply voltage by using no PLL feedback loop, and thereafter, converges the input voltage by the PLL feedback loop within a range from the power-supply voltage to the convergence voltage.

Further, as other operations for achieving the above object, a PLL circuit of the present invention comprises at least: a phase comparator with current mode output; a low-pass filter; and a VCO. The PLL circuit sets an input voltage of the VCO as a power-supply voltage before convergence start, and in the case where a convergence frequency of the PLL circuit is higher than a setting frequency, converges the input voltage by a PLL feedback loop within a range from the power-supply voltage to a convergence voltage. Moreover, in the case where the convergence frequency of the PLL circuit is lower than the setting frequency, the PLL circuit drops the input voltage from the power-supply voltage to 0V by using no PLL feedback loop, and thereafter, converges the input voltage by the PLL feedback loop within a range from 0V to the convergence voltage.

Further, in order to achieve the above object, a PLL circuit of the present invention comprises: a phase comparator with current mode output, for outputting a signal proportional to a phase difference between first input signal modulated in its frequency and second input signal; an LPF connected to an output terminal of the phase comparator with current mode output; a VCO connected to an output terminal of the low-pass filter; a mixer connected to an output terminal of the VCO and converting an output frequency of the VCO so as to output a second signal; first and third constant current sources for outputting a constant current to the output terminal of the phase comparator with current mode output; a second constant current source for inputting a constant current from the output terminal of the phase comparator with current mode output, a first switch connected between the phase comparator with current mode output and a ground and control means for controlling an on-off of the first to third constant current sources and a short-circuit and open of the first switch.

Further, as other structures for achieving the above object, in the PLL circuit of the present invention, the third constant current source is replaced with a second switch connected between an output terminal of the phase comparator with current mode output and a power-supply voltage, and means for controlling an on-off of the second switch is additionally provided.

Further, as other structures for achieving the above object, in the PLL circuit of the present invention, the first and third constant current sources are replaced with a variable current source, and means for controlling an on-off and output current value of the variable current source is additionally provided.

Further, in order to achieve the above object, a wireless mobile station of the present invention comprises: a base band circuit; a modulator for inputting a first base band signal from the base band circuit; a PLL circuit connected to an output of the modulator; a power amplifier connected to an output of the PLL circuit; a receiver circuit for outputting a second base band signal to the base band circuit; an antenna; and a selector connected with the antenna, an input of the receiver circuit and an output of the power amplifier, the base band circuit outputting a control signal for controlling an operation of the wireless mobile station, the PLL circuit comprising the PLL circuit described before. Moreover, the selector is an antenna switch or duplexer.

BRIEF DESCRIPTIONS OF THE DRAWINGS

DESCRIPTION OF THE PREFERRED EMBODIMENTS

Figure 1:
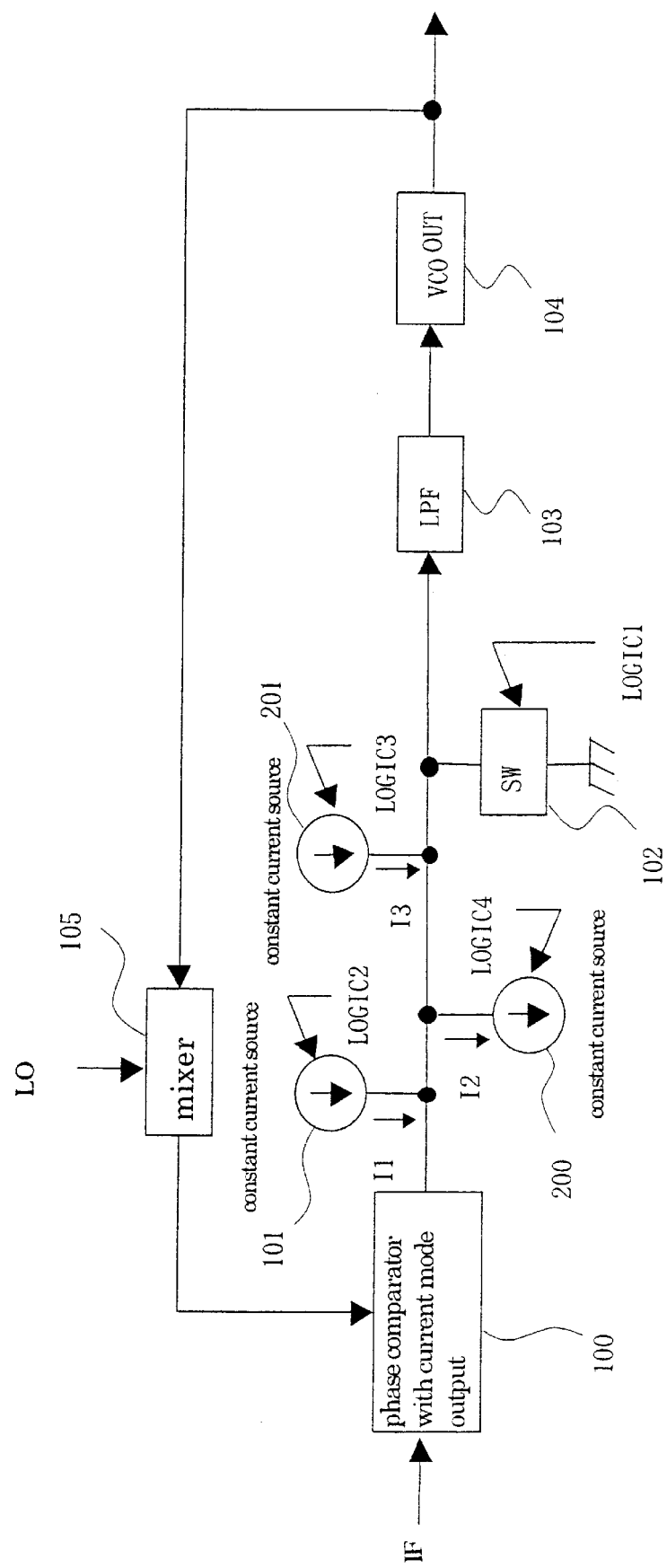
FIG. 1 is a view showing a configuration of a PLL circuit according to a first embodiment of the present invention.

Embodiments of the present invention will be described below with reference to the accompanying drawings. In all figures for explaining the embodiments, like reference numerals are used to designate the same member, and the details are omitted for simplification of description. Moreover, the details of parts overlapping with the contents described in the above are omitted.

FIG. 1 is a view showing a configuration of a PLL circuit according to a first embodiment of the present invention.

The PLL circuit of the present invention is composed of a phase comparator 100 with current mode output, constant current sources 101, 200 and 201, a mixer 105, a LPF 103, a VCO 104 and a SW 102. The output current of the constant current sources 101 and 200 have the same value (I1=I2). Moreover, an output current I3 of the constant current source 201 has a value larger than the constant current sources 101 and 200, for example, 50 times as much as them. In the following description, it is assumed that the VCO 104 has a positive sensitivity. A control signal LOGIC1 is given to the SW 102. In the case where the LOGIC1 is zero "0", the SW 102 becomes an open state; on the other hand, in the case where the LOGIC1 is "1", the SW 102 is short-circuited to ground. Moreover, control signals LOGIC2, LOGIC3 and LOGIC4 are given to the constant current sources 101, 200 and 201, respectively. In the case where the LOGIC2, LOGIC3 and LOGIC4 are zero "0", each constant current source, to which the LOGIC is inputted, becomes an off state, and in the case where these LOGIC are "1", each of them becomes an on state.

Each operation of the phase comparator 100 with current mode output, the mixer 105, the SW 102, LPF 103 and the VCO 104 is the same as the conventional PLL circuit described before.

Figure 2:
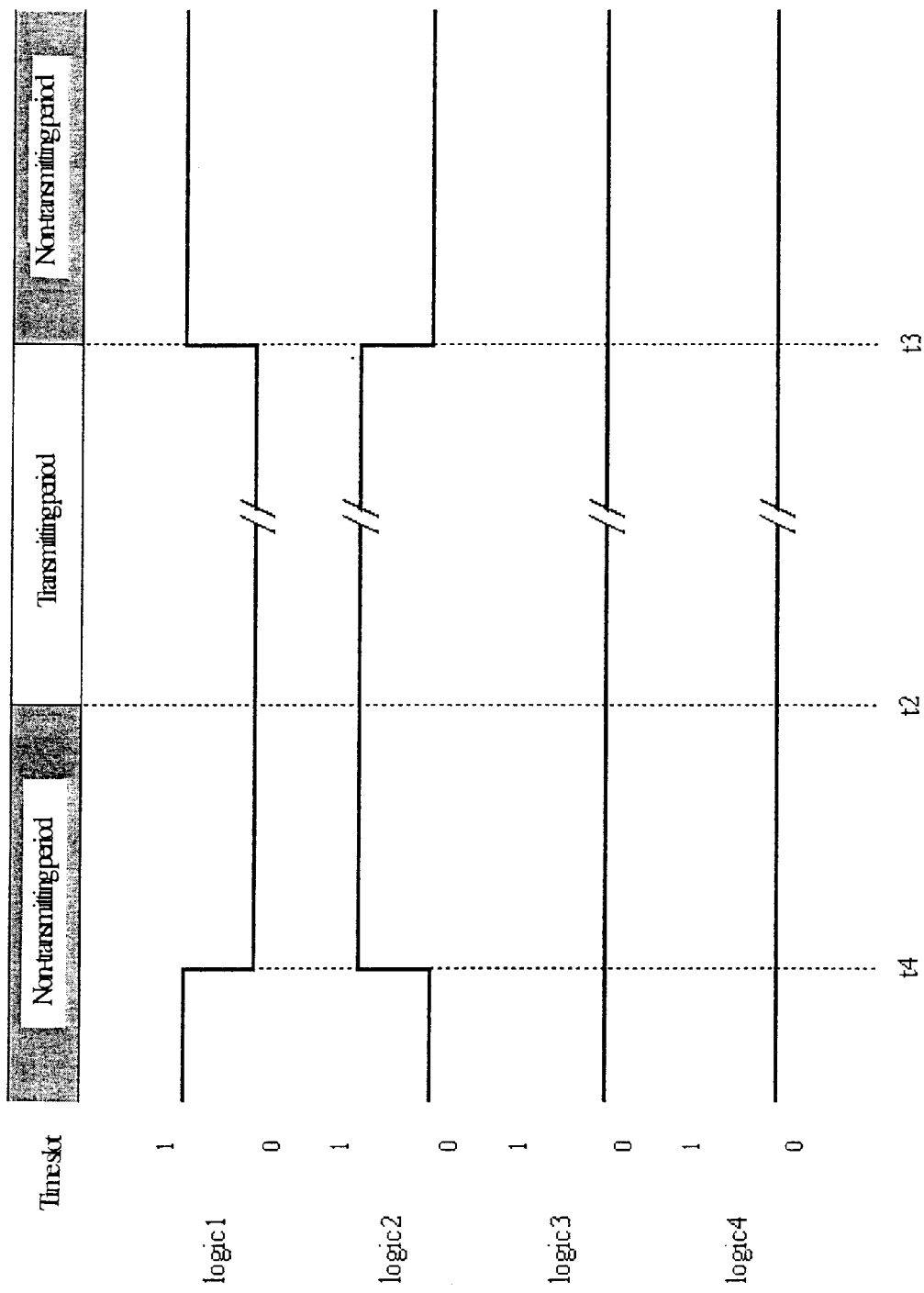
FIG. 2 is a timing chart showing an operation mode 1 of the PLL circuit of the present invention.

The PLL circuit has two operation modes. These operation modes will be described below with reference to FIG. 2 to FIG. 6. FIG. 2 is a timing chart showing an operation mode 1 using no constant current sources 200 and 201. In a time t4 of non-transmitting period, the LOGIC1 is transferred from 1 to 0 so that the SW 102 can be changed from a short-circuit state to an open state. Moreover, the LOGIC2 is transferred from 0 to 1 so that the constant current source 101 can be changed from an off state to an on state. The LOGIC3 and LOGIC4 are always zero "0" so that the constant current sources 200 and 201 are always in an off state. In the operation mode 1, the operation of the PLL circuit is the same as the conventional PLL circuit described before, and therefore, the higher a convergence frequency is, the longer a convergence time becomes. When a transmitting period is completed, the LOGIC1 is transferred from 0 to 1 so that the SW 102 can be changed from an open state to a short-circuit state. Moreover, the LOGIC2 is transferred from 1 to 0 so that the constant current source 101 can be changed from an on state to an off state in preparation for the next transmitting period.

Figure 3:
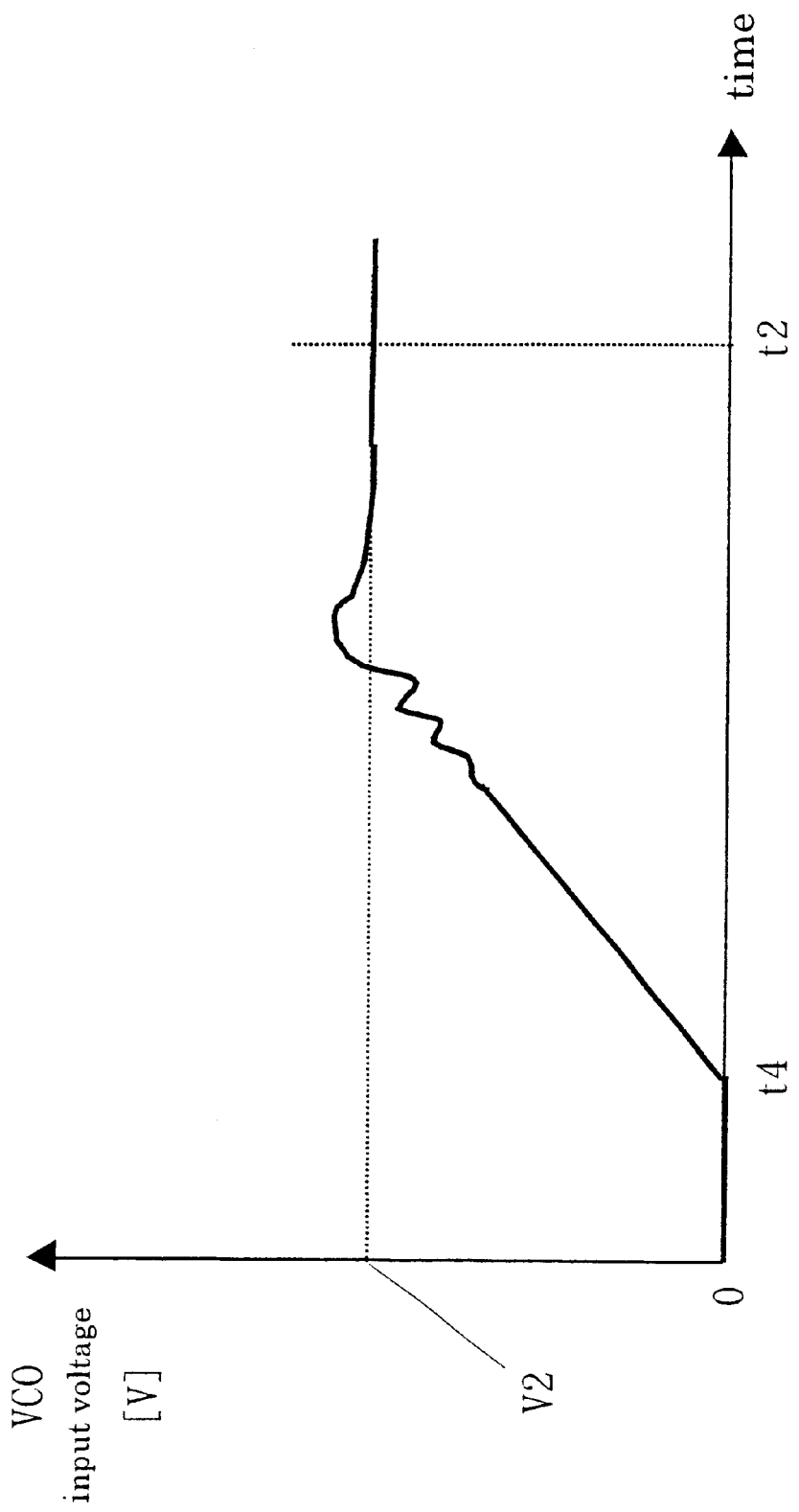
FIG. 3 is a characteristic chart showing a VCO input voltage in the operation mode 1 of the PLL circuit of the present invention.

FIG. 3 is a graph showing a change of input voltage of the VCO 104 in the operation mode 1. The convergence process is the same as the conventional PLL circuit.

Figure 4:
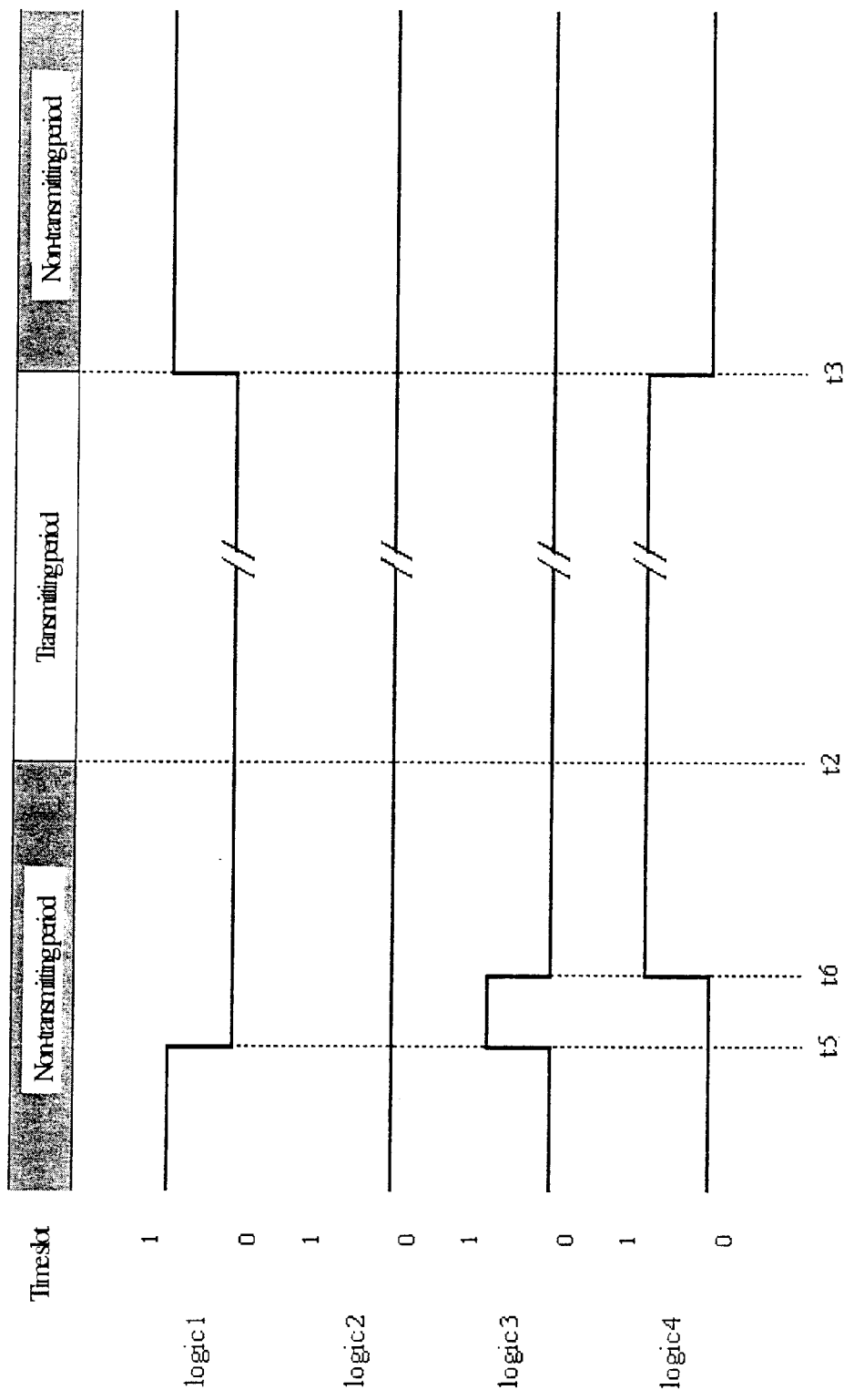
FIG. 4 is a timing chart showing an operation mode 2 of the PLL circuit of the present invention.

FIG. 4 is a timing chart of an operation mode 2 using no constant current source 101. The LOGIC2 is always set to zero "0" so that the constant current source 101 is always in an off state. In a time t5 of non-transmitting period, the LOGIC1 is transferred from 1 to 0 so that the SW 102 can be changed from a short-circuit state to an open state. Moreover, the LOGIC3 is transferred from 0 to 1 so that the constant current source 201 can be changed from an off state to an on state. The capacity of the LPF 103 is charged at a high speed by a large output current of the constant current source 201, and therefore, the input voltage of the VCO 104 is rapidly increased to the maximum voltage. The maximum voltage is determined by a supply voltage of the constant current source 201. Thereafter, in a time t6, the LOGIC3 is transferred from 1 to 0 so that the constant current source 201 can be changed from an on state to an off state. Moreover, the LOGIC4 is transferred from 0 to 1 so that the constant current source 200 can be changed from an off state to an on state. An electric charge stored in the LPF 103 is discharged by the constant current source 200, and therefore, the input voltage of the VCO 104 gradually drops from the maximum voltage, and finally, converges to a convergence frequency. In this case, the higher the convergence frequency is, the shorter the convergence time becomes. When the transmitting period is completed, the LOGIC1 is transferred from 0 to 1 so that the SW 102 can be changed from an open state to a short-circuit state. Moreover, the LOGIC4 is transferred from 1 to 0 so that the constant current source 200 can be changed from an on state to an off state in preparation for the next transmitting period.

Figure 5:
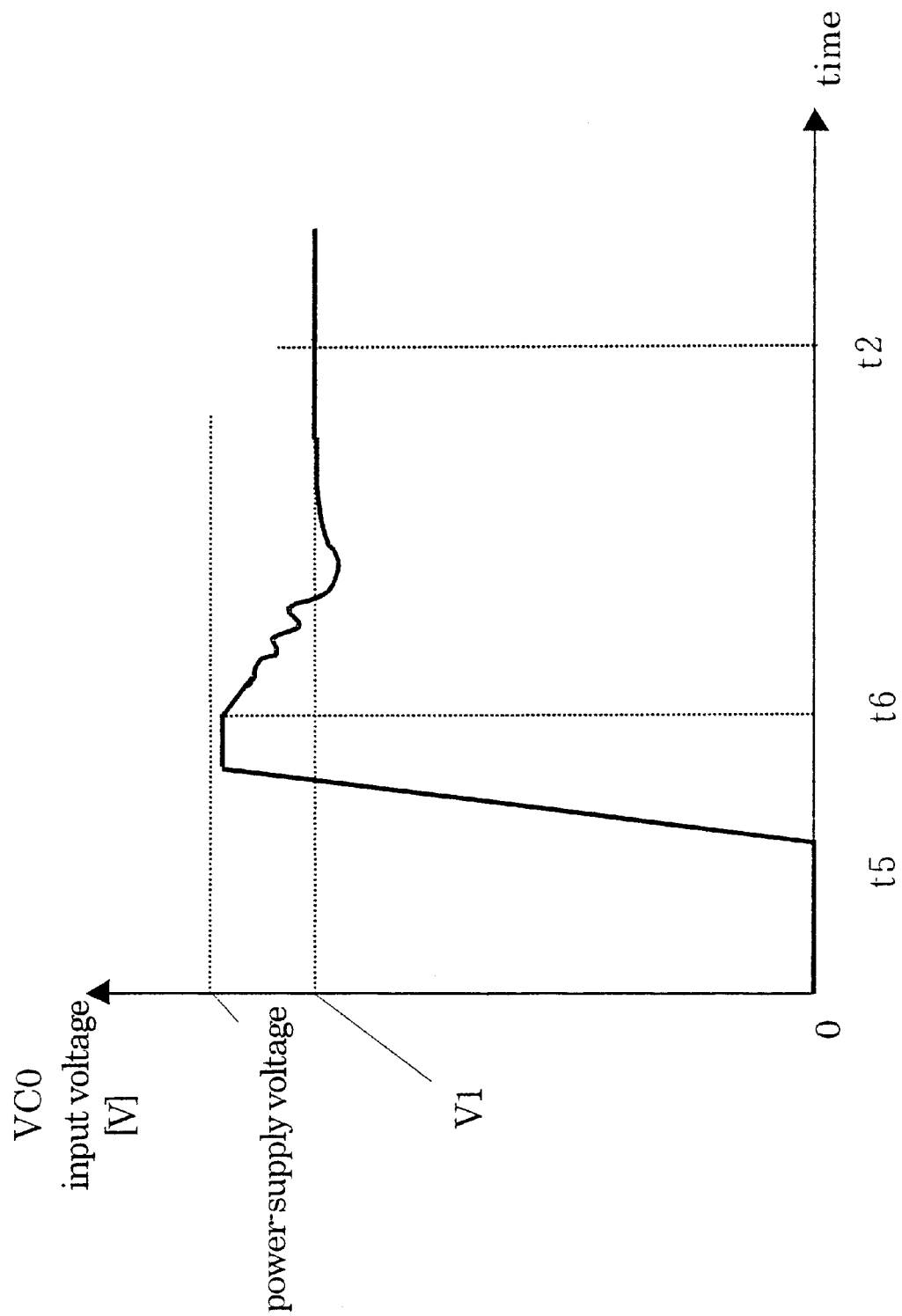
FIG. 5 is a characteristic chart showing a VCO input voltage in the operation mode 2 of the PLL circuit of the present invention.

FIG. 5 is a graph showing a change of input voltage of the VCO 104 in an operation mode 2. Prior to time 5, the input voltage is 0V. At the time t5, the SW 102 becomes an open state, and the input voltage starts to increase linearly. The rate of increase of the input voltage is determined mainly by the output current I3 of the constant current source 201 and the total capacity C of the LPF 103, and is obtained from a relation of I3/C. As described before, the output current I3 is larger than the output current I1, for example, 50 time as much as that; therefore, the rate of increase of the input voltage is also 50 times higher than the rate of increase I1/C determined by the output current I1 in the operation mode 1. Namely, the input voltage is increased to the maximum voltage at a very high speed. When a time t6 comes, the constant current source 201 becomes an off state; therefore, the constant current source 200 starts its operation. The input voltage starts to drop lineally. The rate of decrease of the input voltage is determined mainly by the output current I2 of the constant current source 200 and C (its capacity), and is obtained from a relation of I2/C. Thereafter, in the PLL circuit, a recovery of feedback is made, and then, convergence is completed. The convergence time ts1 in the operation mode 1 is given in the same manner as the conventional PLL circuit. A convergence time ts2 in the operation mode 2 is obtained from the following equation (3), assuming that td=t6−t5, and an output frequency of the VCO 104 is set as f2 when the input voltage is the maximum voltage.

$$ts2=(f2-f1)/Kv \cdot C/I2+td \qquad (3)$$

Figure 6:
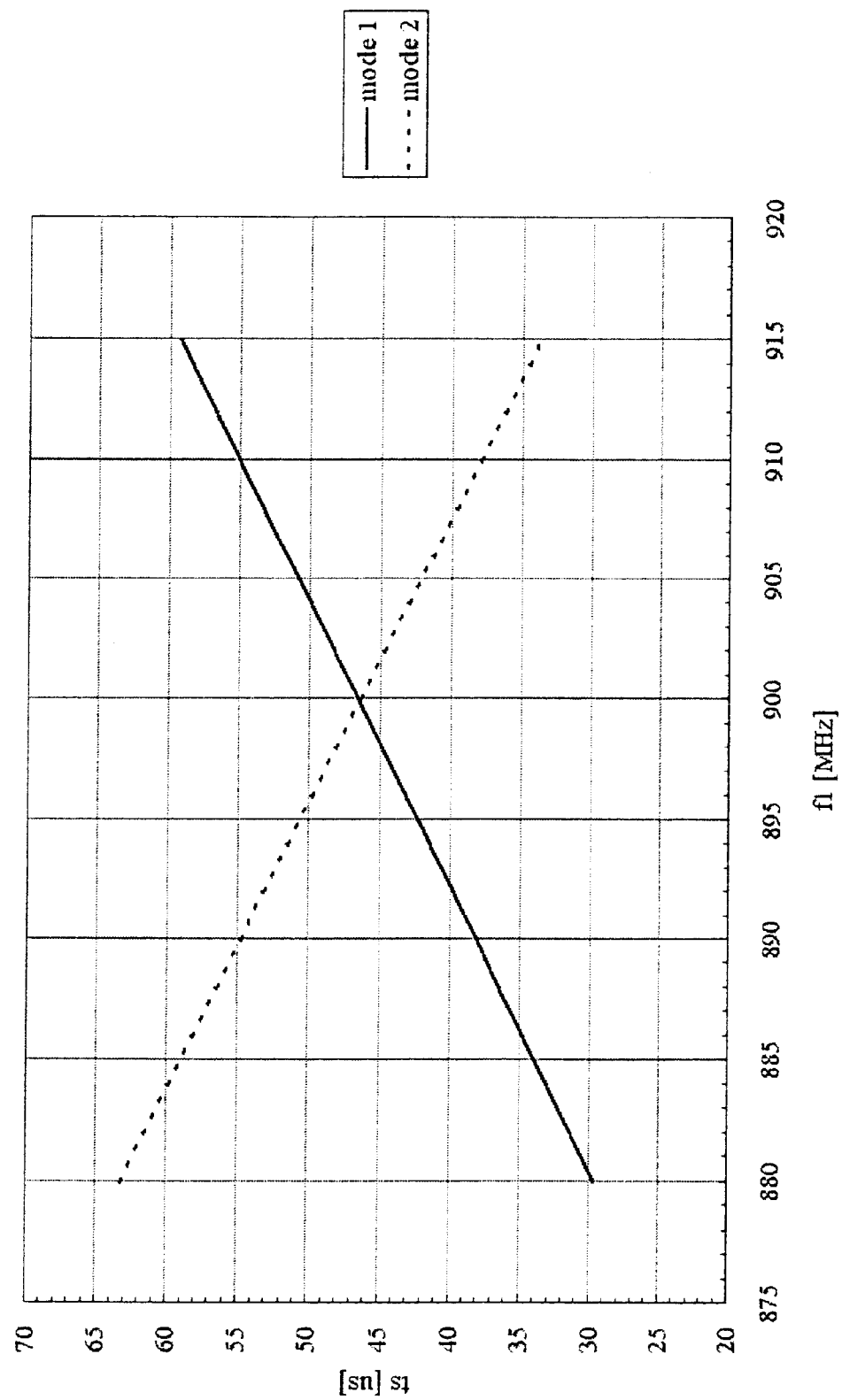
FIG. 6 is a characteristic chart showing a comparison of convergence time between the PLL circuit of the present invention and a conventional PLL circuit.

FIG. 6 is a characteristic view showing a dependency of the convergence frequency f1 of the convergence time ts between the operation modes 1 and 2 in the case where Kv=35 MHz/V, C=16 nF, I1=I2=0.54 mA, f0=845 MHz, f2=943 MHz, and td=10 $\mu$s. Assuming the case of GSM system, f1 is calculated in a range from 880 MHz to 915 MHz. Moreover, in order to calculate the convergence time, the above equations (2) and (3) are used. As is seen from FIG. 6, the maximum convergence time of the conventional PLL circuit using only operation mode 1 is about 60 $\mu$s. However, in this case, the operation mode 1 is used when f1 is equal to or less than 900 MHz, and the operation mode 2 is used when f1 is equal to or more than 900 MHz, and thereby, the maximum convergence time can be reduced to about 47 $\mu$s.

Figure 7:
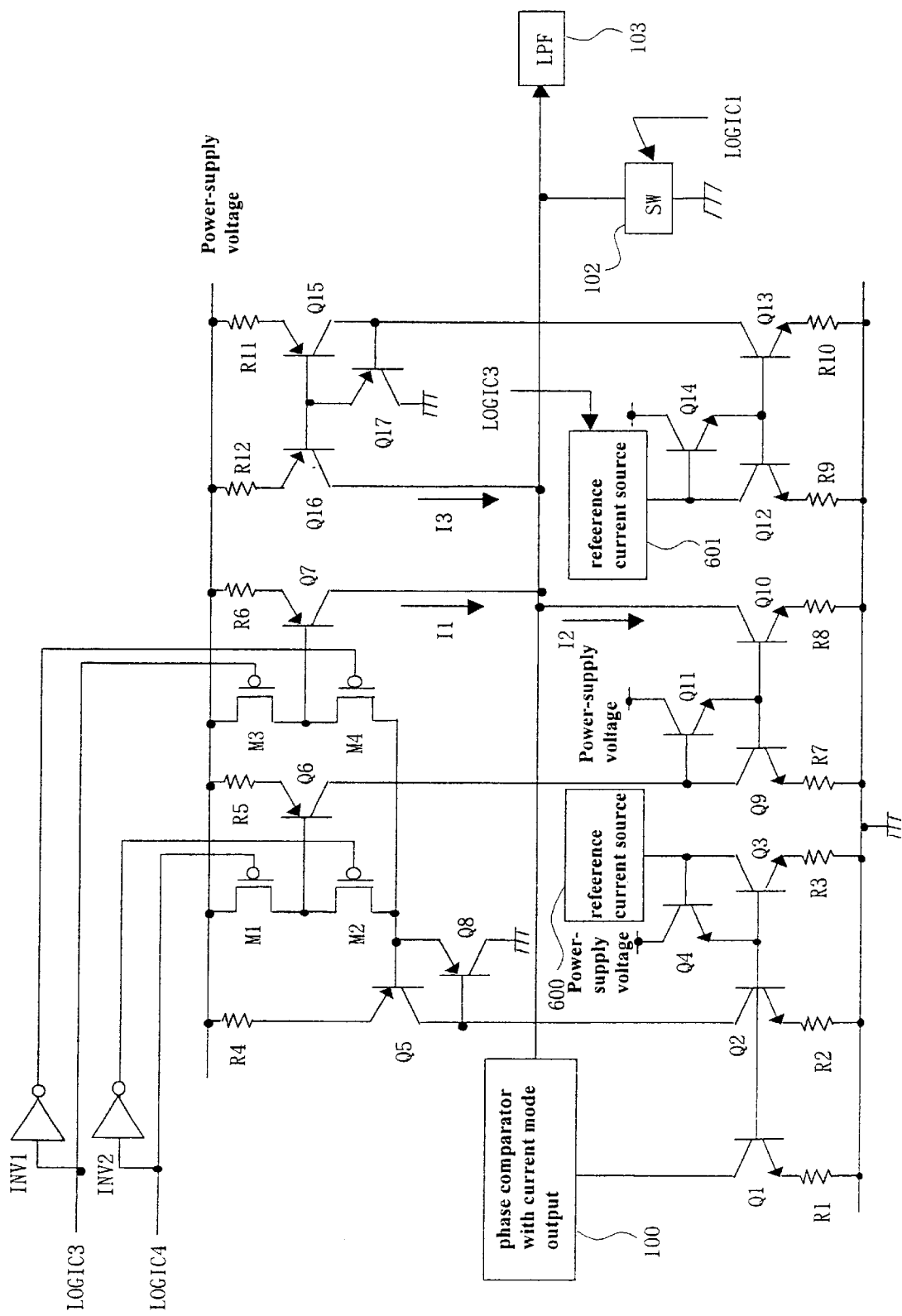
FIG. 7 is a circuit diagram showing a configuration of a constant current source of the PLL circuit of the present invention.

FIG. 7 is a circuit diagram showing each construction of the constant current sources 101, 200 and 201. The circuit is composed of reference current sources 600 and 601, five current mirror circuits, PMOS transistors M1 to M4 and inverters INV1 and INV2. Five current mirror circuits are individually composed of (Q1 to Q4 and R1 to R3), (Q5 to Q8 and R4 to R6), (Q9 to Q11 and R7, R8), (Q12 to Q14 and R9, R10), and (Q15 to Q17 and R11, R12). The reference current sources 600 and 601 are a band gap reference (BGR) circuit, which generates and outputs a constant current from a generated and temperature compensated reference voltage.

The output currents I1 and I2 of FIG. 1 are generated from an output current of the reference current source 600; on the other hand, the output current I3 is generated from the reference current source 601. The on-off control for the output currents I1 and I2 is realized by a switch circuit comprising M1 to M4, INV1 and INV2. For example, in the case where the LOGIC3 is 1, a source/drain of the M3 becomes an open state; on the other hand, a source/drain of the M4 becomes a short-circuit state. Therefore, short-circuit is made between bases of the Q5 and Q7; therefore, the output current I1 is outputted from a collector of the Q7. In the case where the LOGIC3 is zero "0", since the base of the Q7 becomes a power-supply voltage, a collector current of the Q7 is approximately zero "0". The on-off control for the output current I3 is carried out by turning on and off the reference current source 601.

A bias current of the phase comparator 100 with current mode output is also generated from the reference current source 600. As described before, a convergence stability of the PLL circuit is determined by a ratio of the output current of the phase comparator 100 with current mode output to I1 and I2. The I1, I2 and the bias current are generated from the identical reference current, and thereby, it is possible to reduce a dispersion in the ratio of the output current to I1 and I2.

For example, in FIG. 7, 8 times current as much as I1 and I2 flows through the I3 controlled by the LOGIC3. The 8 times is a ratio obtained from the calculation of multiplying an emitter resistance ratio of the current mirror circuit by a current value outputted from the reference current source. More specifically, a ratio of generating current value of (R11/R12)×(R9/R10)×601 to generating current value of (R4/R6)×(R2/R3)×600 is 8:1.

With the above construction, in the case of employing a 0.35 $\mu$m Bipolar CMOS (BiCMOS) process, it is possible to realize the PLL circuit according to the first embodiment of the present invention. In this case, a circuit area merely increases about 6% as compared with the conventional PLL circuit.

Figure 8:
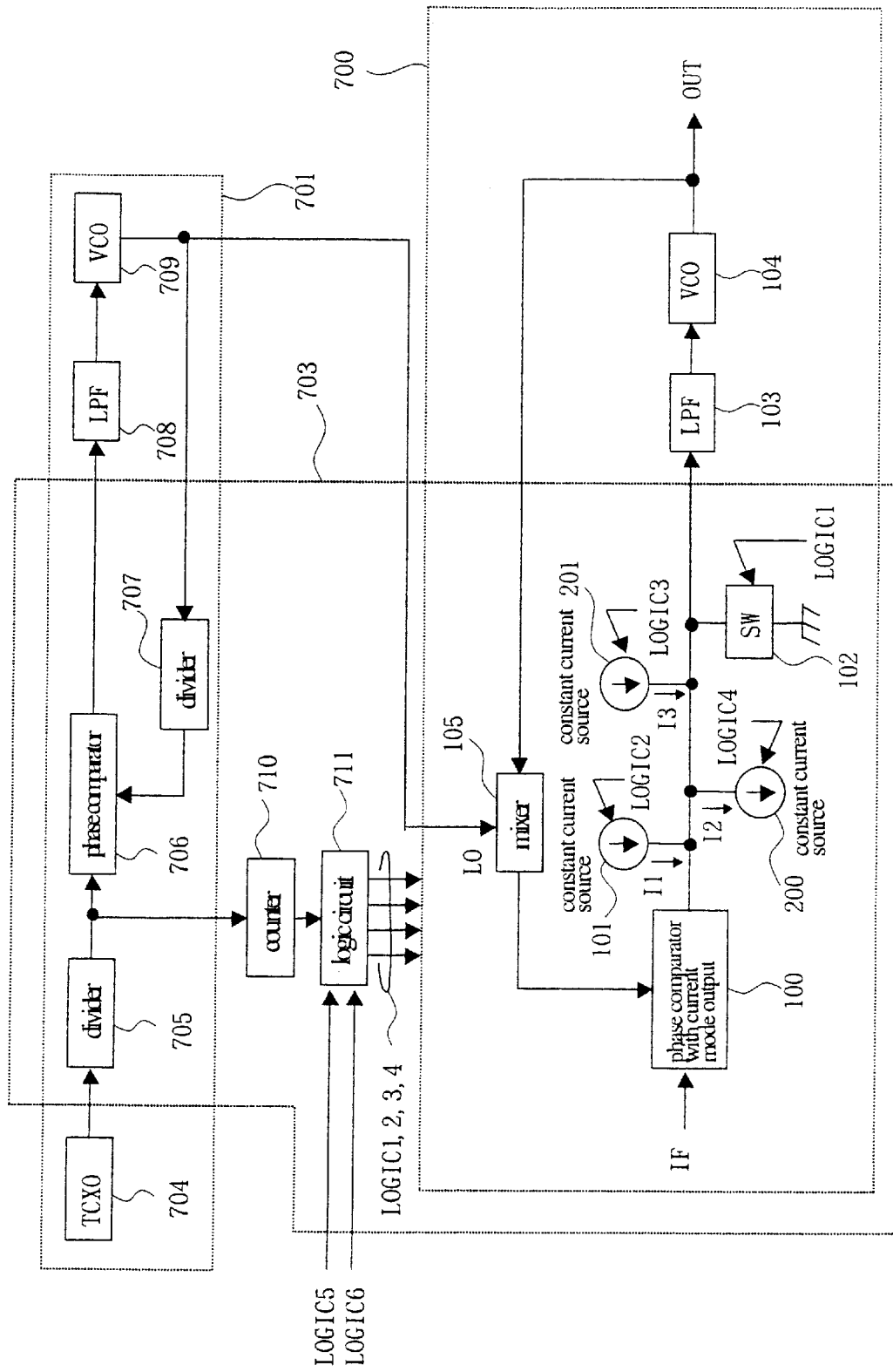
FIG. 8 is a circuit diagram showing a configuration of a LOGIC generating circuit of the PLL circuit of the present invention.

FIG. 8 is a circuit diagram showing a configuration of a generating circuit of the LOGIC1 to LOGIC4. The generating circuit is composed of a PLL circuit 700 of the first embodiment, a PLL circuit 701 for generating an LO signal inputted to the mixer 105 of the first embodiment, a counter 710, and a logic circuit 711. The PLL circuit 701 is composed of a temperature compensate crystal oscillator (TCXO) 704, dividers 705 and 707, a phase comparator 706, an LPF 708 and a VCO 709. A circuit surrounded by a dotted line 703 is a circuit manufactured in the same IC. The TCXO 704 is used as a temperature compensated reference signal source having a high frequency accuracy, and outputs a 13 MHz signal, for example. The divider 705 divides an output signal of the TCXO 704, and then, outputs the divided signal to the phase comparator 706. The divider ratio is 1/65, for example, and the divider outputs a 200 kHz signal. The output signal of the divider 705 is inputted to the counter 710; for this reason, a delay of integer multiples of the output signal period of the divider 705 is generated between input and output of the counter 710. Therefore, by using the delay, it is possible to realize a delay from t5 to t6 in FIG. 4. The logic circuit 711 generates LOGIC1 to LOGIC4 from the output signal of the counter 710 and LOGIC5 and LOGIC6 inputted from the outside of the IC, and outputs these signals to the PLL circuit 700. The LOGIC5 is a signal for determining t4 and t5 of FIG. 2 and FIG. 4; on the other hand, LOGIC6 is a signal for determining the operation mode described before.

Next, the following is a description on a PLL circuit according to a second embodiment of the present invention.

Figure 9:
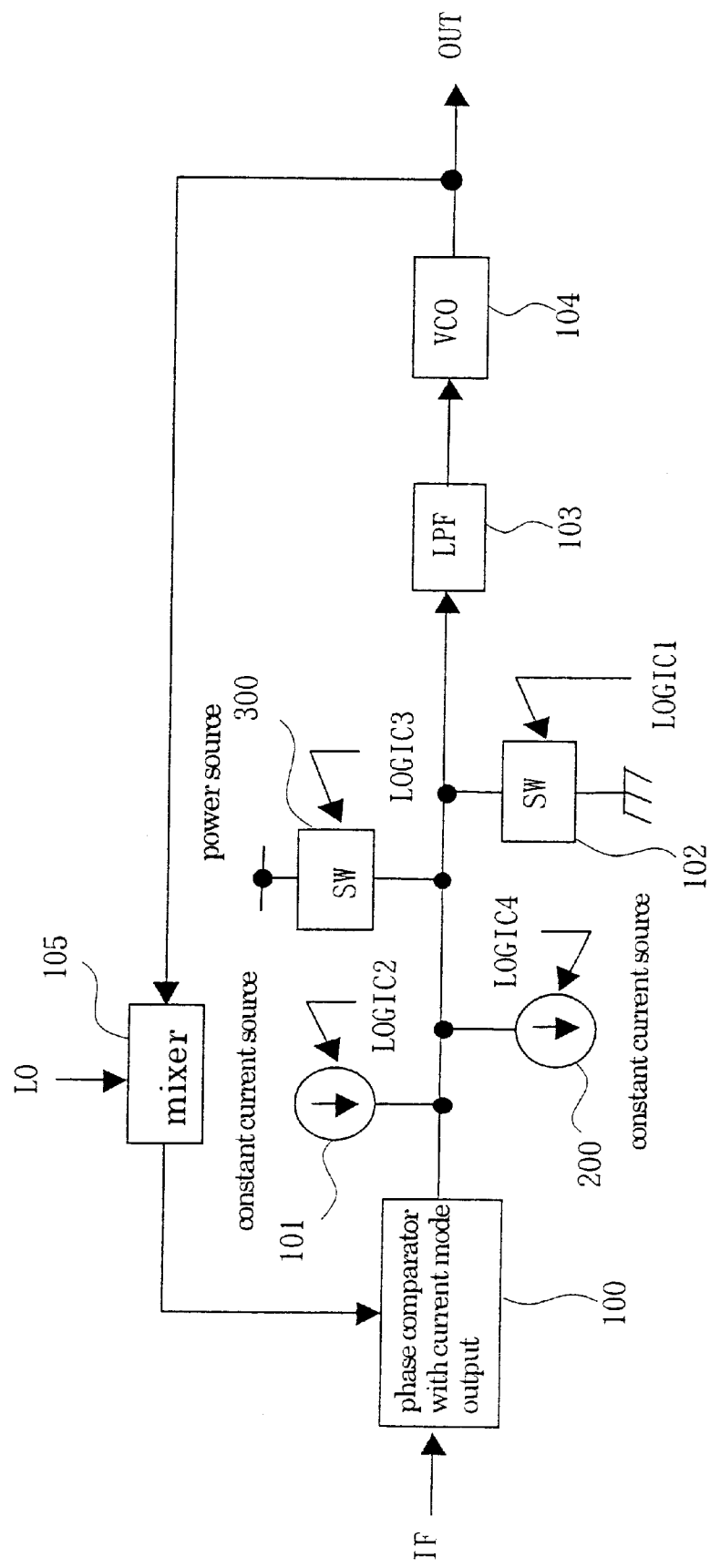
FIG. 9 is a view showing a configuration of a PLL circuit according to a second embodiment of the present invention.

FIG. 9 is a view showing a configuration of a PLL circuit according to a second embodiment of the present invention.

The PLL circuit is a circuit having constituent features that the constant current source 201 is replaced with a SW 300 connected to a power-supply voltage in the above first embodiment. The operation of circuits other than the SW 300 and the LOGIC3 is the same as the above first embodiment. The SW 300 becomes an on state in only period from the time t5 to the time t6 shown in FIG. 4. By doing so, an input terminal of the LPF 103 and a power source are short-circuited; therefore, the capacity of the LPF 103 is charged to the maximum voltage at a high speed by a current from the power source.

Next, the following is a description on a PLL circuit according to a third embodiment of the present invention.

Figure 10:
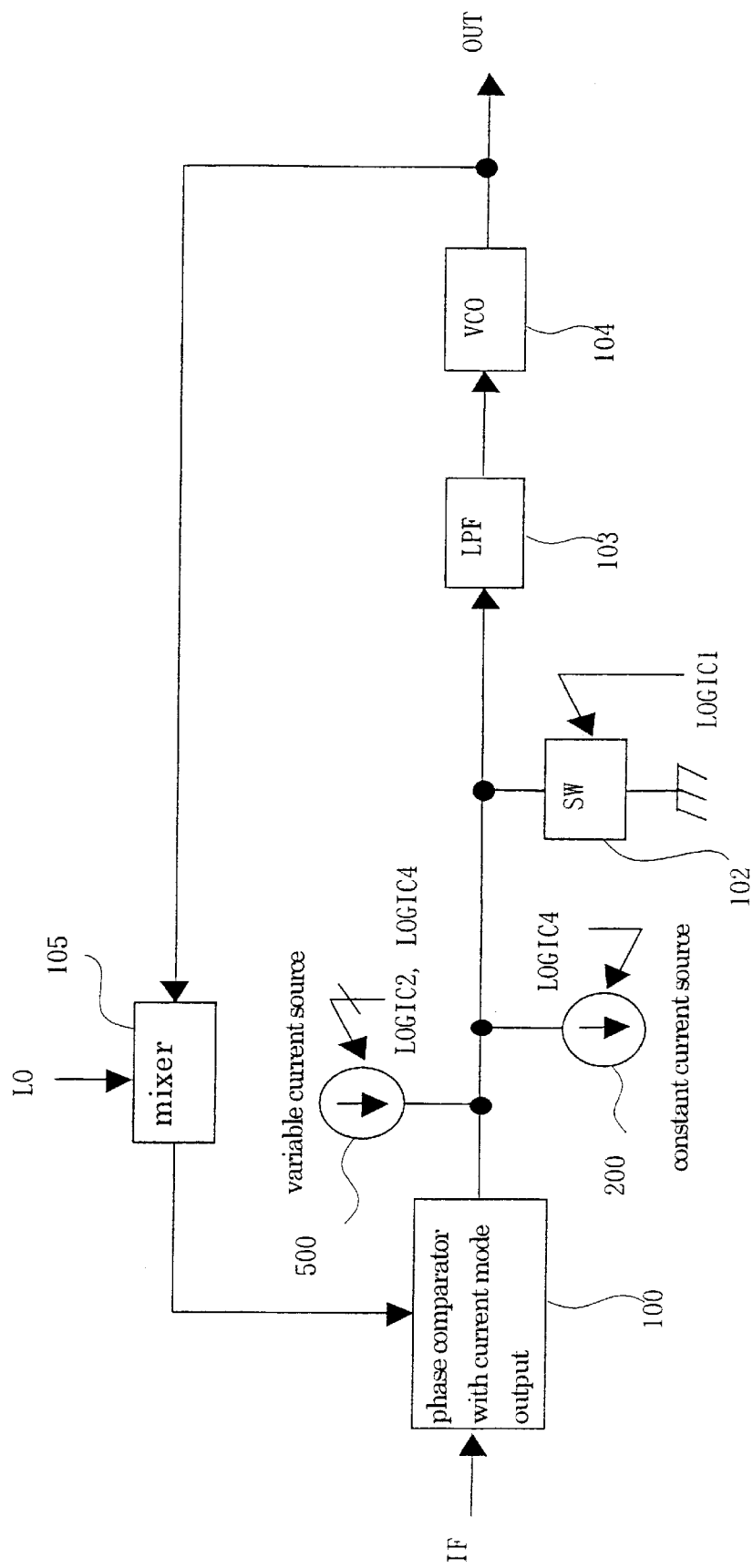
FIG. 10 is a view showing a configuration of a PLL circuit according to a third embodiment of the present invention.

FIG. 10 is a view showing a configuration of a PLL circuit according to a third embodiment of the present invention. The PLL circuit is a circuit having constituent features that the constant current sources 101 and 201 are replaced with a variable current source 500 in the above first embodiment. The variable current source 500 can perform an on-off control and an output current value control by LOGIC2 and LOGIC4. Further, the variable current source 500 can realize the same function as the constant current sources 101, 201 according to the first embodiment and the LOGIC2 and 3.

Figure 11:
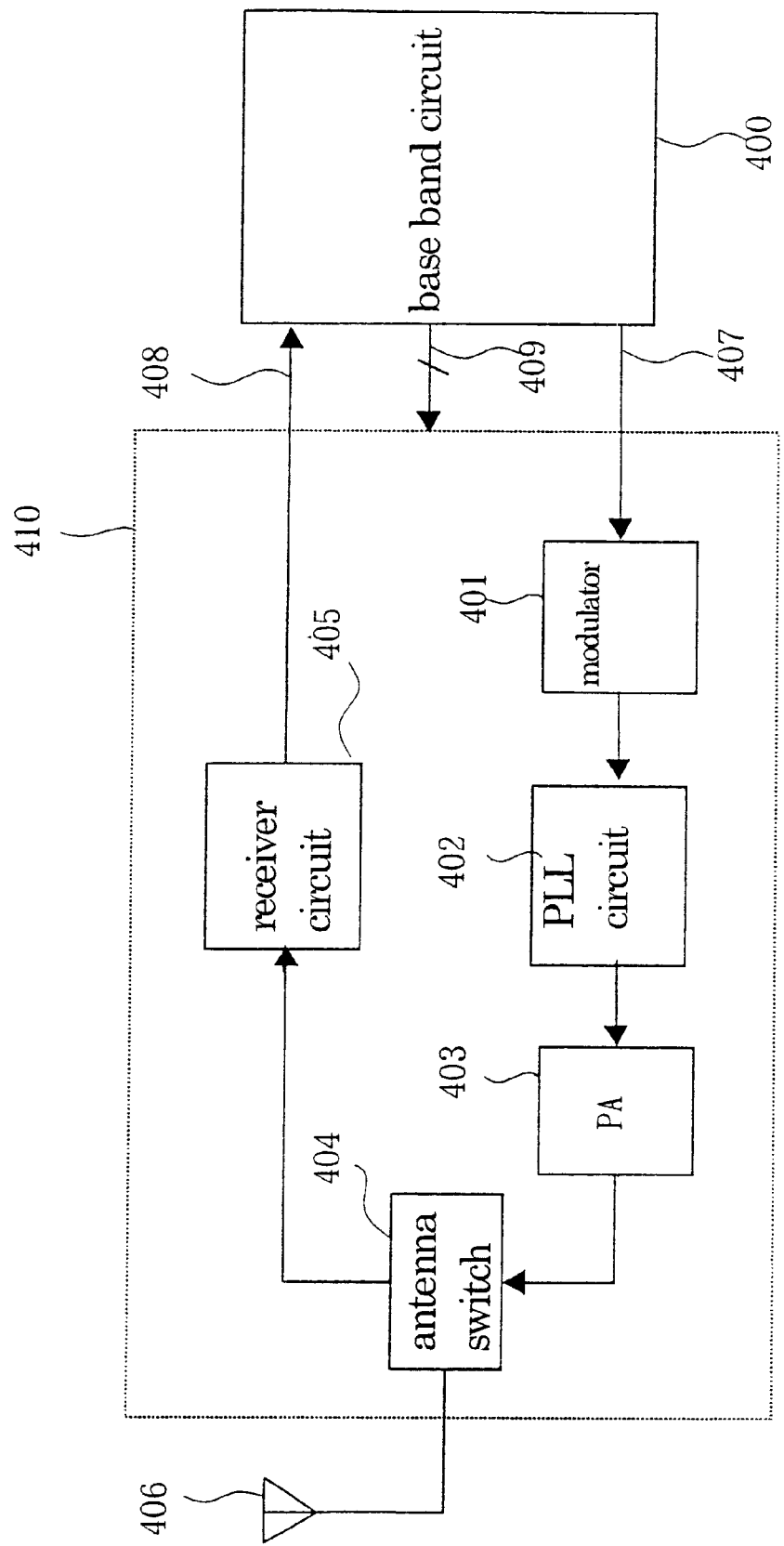
FIG. 11 is a view showing a configuration of a wireless mobile station using the PLL circuit of the present invention.
Figure 12:
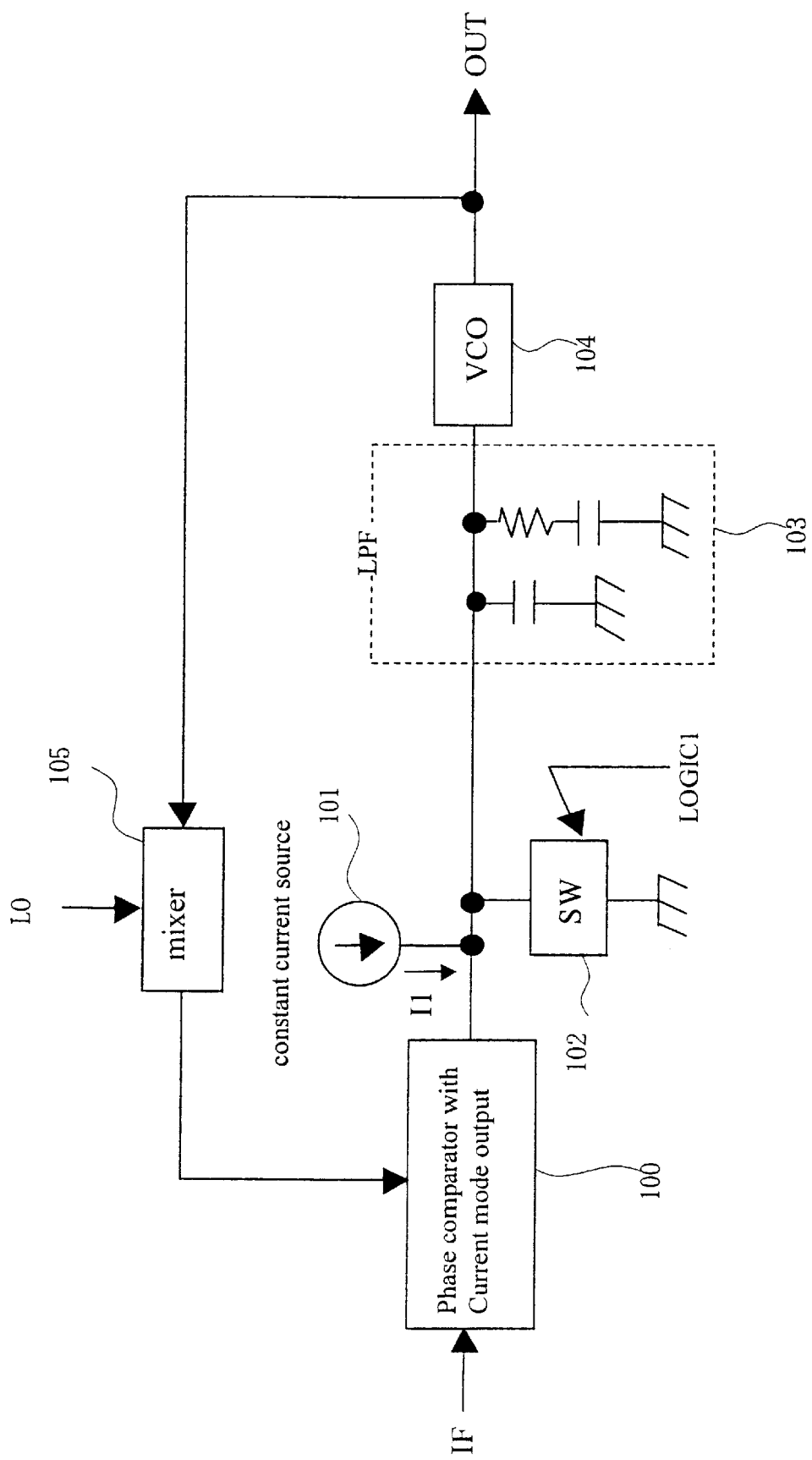
FIG. 12 is a view showing a configuration of a conventional PLL circuit.
Figure 13:
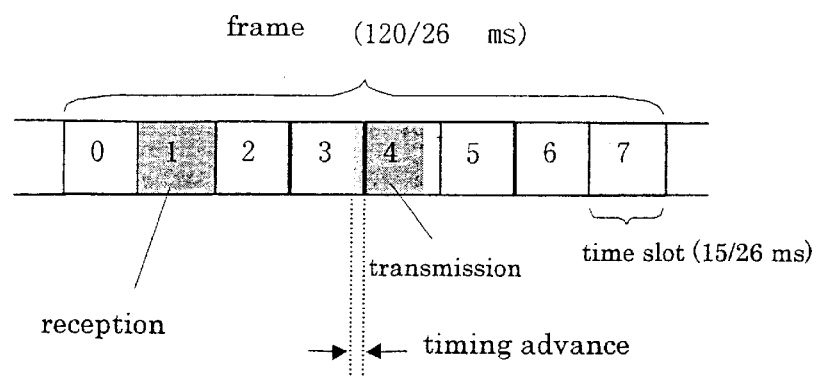
FIG. 13 is a view to explain a transmission-reception timing of a wireless mobile station for GSN system.
Figure 14:
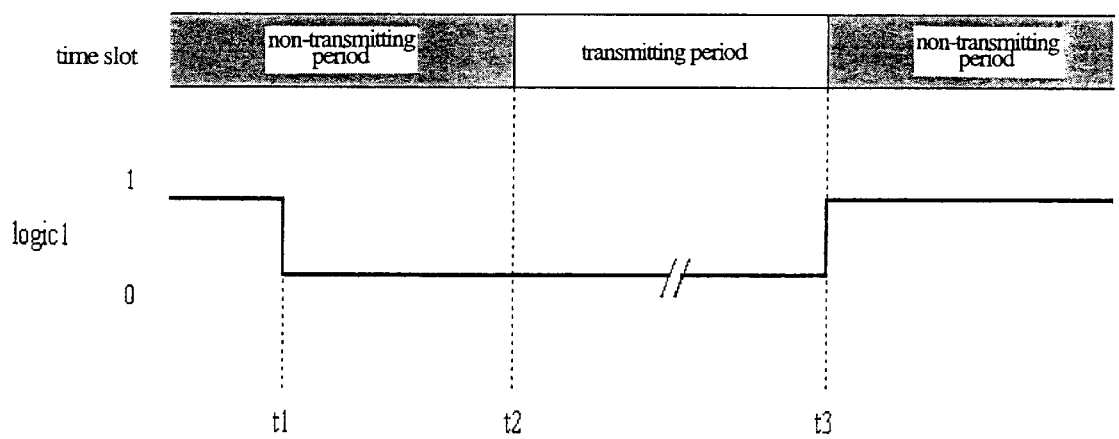
FIG. 14 is a timing chart showing an operation of the conventional PLL circuit.
Figure 15:
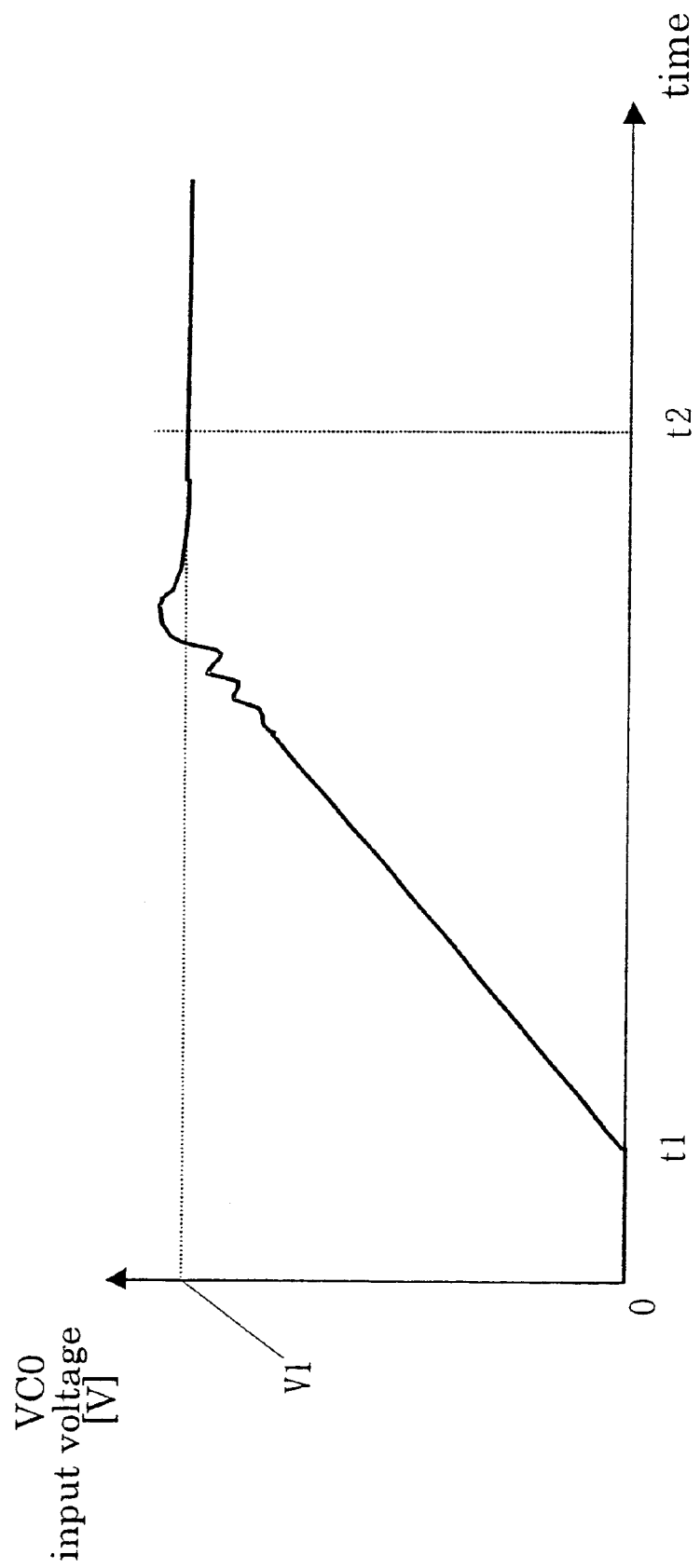
FIG. 15 is a characteristic chart showing a VCO input voltage of the conventional PLL circuit.
Figure 16:
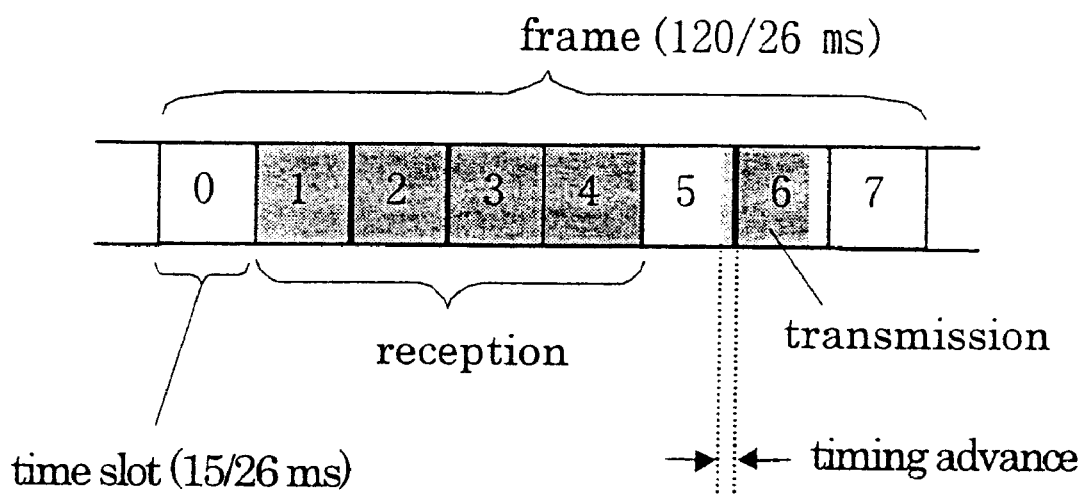
FIG. 16 is a view to explain a transmission-reception timing of a wireless mobile station for GPRS system.

FIG. 11 is a view showing a configuration of a wireless mobile station according to the present invention. The wireless mobile station is composed of a transmitter system comprising the following components, an antenna switch 404, an antenna 406 and a receiver circuit 405. The transmitter system comprises a base band circuit 400, a modulator 401, a PLL circuit 402 of the present invention and a power amplifier (PA) 403.

The base band circuit 400 outputs a base band signal 407 to the modulator 401 on the basis of a speech signal and a data signal, and then, regenerates the speech signal and the data signal on the basis of a base band signal 408 inputted from the receiver circuit 405. Further, the base band circuit 400 outputs a control signal 409 for controlling a circuit 410 constituting the wireless mobile station. In the modulator 401, an IF-band modulating signal is generated on the basis of the base band signal 407. An output signal of the modulator 401 is inputted to the PLL circuit 402 so that a frequency conversion is made, and thereafter, is outputted to the PA 403. In the PA 403, the signal is amplified in its power, and then, is transmitted from the antenna 406 via the antenna switch 404. By the antenna switch 404, the antenna 406 and the PA 403 are connected in transmission; on the other hand, the antenna 406 and the receiver circuit 405 are connected in reception. The signal received by the antenna 406 is inputted to the receiver circuit 405 so as to be modulated, and thereafter, the base band signal 408 is outputted from the receiver circuit 405.

Therefore, according to this second embodiment, the LPF 103 charging constant current source 101, the discharging constant current source 200 and the high-speed charging constant current source 201 are connected to the output of the phase comparator 100 with current mode output of the PLL circuit. By doing so, in the case where a convergence frequency of the PLL circuit is low, the input voltage of the VCO 104 is increased from 0V so as to be converged by using the constant current source 101. On the other hand, in the case where the convergence frequency of the PLL circuit is high, the input voltage of the PLL circuit is temporarily increased to the maximum voltage by using the constant current source 201. Thereafter, the input voltage is gradually dropped from the maximum voltage so as to be converged by using the constant current source 200. Thus, the above operation is selected by the convergence frequency, and thereby, it is possible to shorten the maximum convergence time of the PLL circuit.

The invention made by the present inventors has been described in detail on the basis of the above embodiments. The present invention is not limited to the above embodiments, and of course, various modifications and changes are possible without diverging from the scope of the present invention.

In the invention disclosed in this application, the following effects can be obtained.

According to the present invention, two constant current sources are merely added to the conventional PLL circuit, and thereby, it is possible to shorten the maximum convergence time to about half.

What is claimed is:

1. A PLL circuit comprising:
   a phase comparator with current mode output, for outputting a signal proportional to a phase difference between a first input signal modulated in its frequency and a second input signal;
   a low-pass filter connected to an output terminal of the phase comparator with current mode output;
   a VCO connected to an output terminal of the low-pass filter;
   a mixer connected to an output terminal of the VCO and converting an output frequency of the VCO so as to output said second input signal of said phase comparator with current mode output;
   first and second constant current sources connected to the output terminal of the phase comparator with current mode output;
   a first switch connected between the phase comparator with current mode output and a first reference voltage;
   a second switch connected between the phase comparator with current mode output and a second reference voltage; and
   a controller arranged to control an on-off of the first and second constant current sources and to control a short-circuit and open of the first and second switches.

2. The PLL circuit according to claim 1,
   wherein the first reference voltage is 0V,
   wherein the second reference voltage is a power-supply voltage,
   wherein the first constant current source outputs a constant current to the output terminal of the phase comparator with current mode output, and
   wherein the second constant current source inputs a constant current from the output terminal of the phase comparator with current mode output.

3. The PLL circuit according to claim 2,
   wherein the PLL circuit is constructed in a manner that in a non-operating state, the first and second constant current sources are in an off state so that the first switch is short-circuited and so that the second switch is opened, and first and second means are used for a transfer from the non-operating state to an operating state, and further, the first means is used in the case where a convergence frequency of the PLL circuit satisfies a condition that it is a frequency between an output frequency of the VCO in short-circuit of the first switch and a setting frequency, while the second means is used in the case where it does not satisfy the condition,
   wherein the first means opens the first switch and turns on the first constant current source, and wherein the second means opens the first switch and short-circuits the second switch, and opens the second switch while turning on the second constant current source, after a predetermined time elapses.

4. The PLL circuit according to claim 3,
wherein output current values of the first and second constant current sources are equal to each other.

5. The PLL circuit according to claim 1,
wherein the first reference voltage is a power-supply voltage,
wherein the second reference voltage is 0V,
wherein the first constant current source inputs a constant current from the output terminal of the phase comparator with current mode output, and
the second constant current source outputs a constant current to the output terminal of the phase comparator with current mode output.

6. The PLL circuit according to claim 5,
wherein the PLL circuit is constructed in a manner that in a non-operating state, the first and second constant current sources are in an off state so that the first switch is short-circuited and so that the second switch is opened, and first and second means are used for a transfer from the non-operating state to an operating state, and further, the first means is used in the case where a convergence frequency of the PLL circuit satisfies a condition that it is a frequency between an output frequency of the VCO in short-circuit of the first switch and a setting frequency, while the second means is used in the case where it does not satisfy the condition,
wherein the first means opens the first switch and turns on the first constant current source, and
wherein the second means opens the first switch and short-circuits the second switch, and opens the second switch while turning on the second constant current source, after a predetermined time elapses.

7. The PLL circuit according to claim 6,
wherein output current values of the first and second constant current sources are equal to each other.

8. The PLL circuit according to claim 1,
wherein said first switch is controlled by a signal independent from the input voltage of the VCO, and wherein said second switch is controlled by a signal independent from the input voltage of the VCO.

9. A PLL circuit comprising:
a phase comparator with current mode output, for outputting a signal proportional to a phase difference between a first input signal modulated in its frequency and a second input signal;
a low-pass filter connected to an output terminal of the phase comparator with current mode output;
a VCO connected to an output terminal of the low-pass filter;
a mixer connected to an output terminal of the VCO and converting an output frequency of the VCO so as to output said second input signal of said phase comparator with current mode output;
a variable current source and a constant current source connected to the output terminal of the phase comparator with current mode output;
a switch connected between the phase comparator with current mode output and a first reference voltage; and
a controller arranged to control an on-off of the variable current source, an output current value, and an on-off of the constant current source, and to control a short-circuit and open of the switch.

10. The PLL circuit according to claim 9,
wherein the reference voltage, is 0V,
wherein the variable current source outputs a current to the output terminal of the phase comparator with current mode output, and
wherein the constant current source inputs a constant current from the output terminal of the phase comparator with current mode output.

11. The PLL circuit according to claim 10,
wherein the PLL circuit is constructed in a manner that in a non-operating state, the variable current source and the constant current sources are in an off state, the switch is short-circuited, and first and second means are used for a transfer from the non-operating state to an operating state, and further, the first means is used in the case where a convergence frequency of the PLL circuit satisfies a condition that it is a frequency between an output frequency of the VCO in short-circuit of the first switch and a setting frequency, while the second means is used in the case where it does not satisfy the condition,
wherein the first means opens the switch and turns on the variable current source so that the variable current source outputs a first constant current value, and
wherein the second means opens the switch and turns on the variable current source so that the variable current source outputs a second constant current value, and turns off the variable current source while turning on the constant current source, after a predetermined time elapses.

12. The PLL circuit according to claim 11,
wherein the first constant current value and an output current value of the constant current are equal to each other, and the second constant current value is at least twice as great as the first constant current value and the output current value of the constant current.

13. The PLL circuit according to claim 9,
wherein the reference voltage is a power-supply voltage,
wherein the variable current source inputs a current from the output terminal of the phase comparator with current mode output, and
wherein the constant current source outputs a constant current to the output terminal of the phase comparator with current mode output.

14. The PLL circuit according to claim 13,
wherein the PLL circuit is constructed in a manner that in a non-operating state, the variable current source and the constant current sources are in an off state, the switch is short-circuited, and first and second means are used for a transfer from the non-operating state to an operating state, and further, the first means is used in the case where a convergence frequency of the PLL circuit satisfies a condition that it is a frequency between an output frequency of the VCO in short-circuit of the first switch and a setting frequency, while the second means is used in the case where it does not satisfy the condition;
wherein the first means opens the switch and turns on the variable current source so that the variable current source outputs a first constant current value, and
wherein the second means opens the switch and turns on the variable current source so that the variable current source outputs a second constant current value, and turns off the variable current source while turning on the constant current source, after a predetermined time elapses.

15. The PLL circuit according to claim 14, wherein the first constant current value and an output current value of the constant current are equal to each other, and the second constant current value is at least twice as great as the first constant current value and the output current value of the constant current.

16. The PLL circuit according to claim 9, wherein said switch is controlled by a signal independent from the input voltage of the VCO.

17. A wireless mobile station comprising:

a base band circuit;

a modulator for inputting a first base band signal from the base band circuit;

a PLL circuit connected to an output of the modulator;

a power amplifier connected to an output of the PLL circuit;

a receiver circuit for outputting a second base band signal to the base band circuit;

an antenna; and a selector connected with the antenna, an input of the receiver circuit and an output of the power amplifier;

wherein the base band circuit outputs a control signal for controlling an operation of the wireless mobile station; and wherein the PLL circuit comprises:

a phase comparator with current mode output, for outputting a signal proportional to a phase difference between a first input signal modulated in its frequency and a second input signal;

a low-pass filter connected to an output terminal of the phase comparator with current mode output;

a VCO connected to an output terminal of the low-pass filter;

a mixer connected to an output terminal of the VCO and converting an output frequency of the VCO so as to output said second input signal of said phase comparator with current mode output;

first and second constant current sources connected to the output terminal of the phase comparator with current mode output;

a first switch connected between the phase comparator with current mode output and a first reference voltage;

a second switch connected between the phase comparator with current mode output and a second reference voltage; and a controller arranged to control an on-off of the first and second constant current sources and to control a short-circuit and open of the first and second switches.

18. The PLL circuit according to claim 17, wherein said first switch is controlled by a signal independent from the input voltage of the VCO, and wherein said second switch is controlled by a signal independent from the input voltage of the VCO.

* * * * *